(12) United States Patent
Kamins et al.

(10) Patent No.: US 7,804,175 B2
(45) Date of Patent: Sep. 28, 2010

(54) SEMICONDUCTOR STRUCTURES INCLUDING CONDUCTIVE VIAS CONTINUOUSLY EXTENDING THERETHROUGH AND METHODS OF MAKING THE SAME

(75) Inventors: Theodore I. Kamins, Palo Alto, CA (US); Philip J. Kuekes, Palo Alto, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 168 days.

(21) Appl. No.: 11/700,034

(22) Filed: Jan. 31, 2007

(65) Prior Publication Data
US 2008/0179756 A1 Jul. 31, 2008

(51) Int. Cl.
*H01L 23/52* (2006.01)
*H01L 21/4763* (2006.01)

(52) U.S. Cl. .................. 257/774; 257/E23.141; 257/E21.141; 257/E21.597; 257/773; 257/775; 257/776; 257/690; 438/618

(58) Field of Classification Search ............... 257/774, 257/773, 200, E21.495, E23.141, 775, 776, 257/690, E21.597; 438/618
See application file for complete search history.

(56) References Cited

U.S. PATENT DOCUMENTS

| | | | |
|---|---|---|---|
| 3,982,268 A | 9/1976 | Anthony et al. | |
| 4,257,824 A | 3/1981 | Jackson et al. | |
| 4,275,410 A | 6/1981 | Grinberg et al. | |
| 4,377,423 A | 3/1983 | Anthony | |
| 4,628,174 A | 12/1986 | Anthony | |
| 4,720,308 A | 1/1988 | Anthony et al. | |
| 5,402,435 A * | 3/1995 | Shiono et al. | 372/43.01 |
| 5,528,080 A | 6/1996 | Goldstein | |
| 6,448,589 B1 | 9/2002 | Casey et al. | |
| 6,676,438 B2 * | 1/2004 | Zhou et al. | 439/482 |
| 6,831,367 B2 * | 12/2004 | Sekine | 257/774 |
| 6,850,084 B2 | 2/2005 | Hembree | |
| 6,873,054 B2 * | 3/2005 | Miyazawa et al. | 257/774 |
| 7,115,437 B2 | 10/2006 | Allen et al. | |
| 7,130,455 B2 | 10/2006 | Pezzani | |
| 7,358,615 B2 * | 4/2008 | Heck et al. | 257/776 |
| 7,598,167 B2 * | 10/2009 | Watkins et al. | 438/622 |
| 2002/0047210 A1 * | 4/2002 | Yamada et al. | 257/774 |
| 2003/0157741 A1 * | 8/2003 | Oohata et al. | 438/34 |

(Continued)

FOREIGN PATENT DOCUMENTS

JP 8-130220 * 5/1995

(Continued)

OTHER PUBLICATIONS

Cline, H.E. et al., "Thermomigration of Aluminum-rich liquid droplets in silicon." J. Appl. Phys., vol. 43, No. 11, Nov. 1972, pp. 4391-4395.

(Continued)

*Primary Examiner*—Alexander O Williams

(57) ABSTRACT

Semiconductor structures are disclosed including a substrate comprising a semiconductor material and having opposed first and second surfaces, and at least one conductive via extending from the first surface to the second surface. The conductive vias can extend at angles relative to the first surface, such as acute angles or 90°. The conductive vias can include segments that extend at different angles. Methods of forming conductive vias in semiconductor structures are provided. In the methods, a thermal gradient is applied in combination with an electric field to form conductive vias.

4 Claims, 5 Drawing Sheets

U.S. PATENT DOCUMENTS

| | | | |
|---|---|---|---|
| 2004/0016942 A1* | 1/2004 | Miyazawa et al. | 257/200 |
| 2004/0061238 A1* | 4/2004 | Sekine | 257/774 |
| 2004/0261839 A1 | 12/2004 | Gee et al. | |
| 2006/0046475 A1* | 3/2006 | Wark et al. | 438/667 |
| 2009/0065482 A1* | 3/2009 | Komiyama et al. | 216/99 |

OTHER PUBLICATIONS

Anthony, T.R. et al., "Random walk of liquid droplets migrating in silicon." J. Appl. Phys., vol. 47, No. 6, Jun. 1976, pp. 2316-2324.

Anthony, T.R. et al., "Thermal Migration of Liquid Droplets through Solids." J. Appl. Phys., vol. 42, No. 9, Aug. 1971, pp. 3380-3387.

* cited by examiner

SEMICONDUCTOR STRUCTURES INCLUDING CONDUCTIVE VIAS CONTINUOUSLY EXTENDING THERETHROUGH AND METHODS OF MAKING THE SAME

BACKGROUND

In semiconductor device fabrication processes, conductive vias composed of electrically conductive materials are formed in material layers to provide interconnections for transferring electrical signals between levels of the devices. A via is fabricated by forming a through hole through the thickness of a layer. Vias are conventionally formed by photolithography and etching techniques. Vias can be formed by other techniques, such as laser drilling. A metal, such as aluminum or copper, is deposited in the via to form an electrically conductive pathway through a layer.

A problem that arises in via fabrication is achieving adequate filling of the vias with the metal. Metal is conventionally deposited in vias by sputter or electrochemical deposition. Straight via sidewalls, decreasing via diameters and increasing via aspect ratios (i.e., the ratio of via length to via diameter) have increased the difficulty of achieving adequate filling of vias with metal by sputter or electrochemical deposition.

To enhance the filling of vias with metal by sputter or electrochemical deposition, vias can be formed with sloped sidewalls (i.e., sloped vias). However, it is still desirable to form vias with vertical sidewalls. First, vias with vertical sidewalls (i.e., vertical vias) require less area than sloped vias. In submicron technologies, the extra area that is required for sloped vias reduces the maximum packing density. Second, when dry etching is used to open the vias, it is often easier to produce vertical sidewalls than sloped sidewalls. See S. Wolf and R. F. Tauber, *Silicon Processing for the VLSI Era, Volume 1—Process Technology*, Lattice Press, Sunset Beach, Calif., 2nd ed. 2000, pp. 770-78. Accordingly, because it is desirable to form vias with vertical sidewalls, but decreasing via diameters and increasing via aspect ratios have increased the difficulty of achieving adequate filling of vias by sputter or electrochemical deposition, it would be desirable to provide a method of forming conductive vias that can overcome disadvantages of conventional sputter and electrochemical deposition techniques.

SUMMARY

An exemplary embodiment of a semiconductor structure comprises a substrate comprising a semiconductor material and having a first surface and an opposite second surface; and at least one conductive via extending continuously through the substrate from the first surface to the second surface at a substantially constant first acute angle defined relative to a perpendicular to the first surface.

Another exemplary embodiment of a semiconductor structure comprises a substrate comprising a semiconductor material and having a first surface and an opposite second surface; and at least one conductive via extending continuously through the substrate from the first surface to the second surface, the conductive via including at least one first segment extending at a defined first angle of more than 0° relative to the first surface and at least one second segment extending at a defined second angle of more than 0° relative to the first surface, wherein the first angle is different from the second angle.

Another exemplary embodiment of a semiconductor structure comprises a substrate comprising a semiconductor material and having a first surface and an opposite second surface; and at least two of: a first conductive via extending continuously through the substrate from the first surface to the second surface at an acute angle defined relative to a perpendicular to the first surface; a second conductive via extending continuously through the substrate from the first surface to the second surface substantially perpendicular to the first surface; and a third conductive via extending continuously through the substrate from the first surface to the second surface, the third conductive via including at least one first segment extending at a defined first angle of more than 0° relative to the first surface and at least one second segment extending at a defined second angle of more than 0° relative to the first surface, wherein the first angle is different from the second angle.

An exemplary embodiment of a method of forming conductive vias in a semiconductor structure comprises heating a substrate comprising a semiconductor material with at least one solid metal particle located on the first surface; the heating forms a metal-semiconductor eutectic material and produces a thermal gradient across the substrate from the first surface to an opposite second surface to cause metal-semiconductor eutectic material to thermomigrate through the substrate from the first surface to the second surface; and simultaneously applying an electric field to the substrate to cause the metal-semiconductor eutectic material to electromigrate through the substrate from the first surface to the second surface to thereby form at least one conductive via in the substrate that extends continuously from the first surface to the second surface.

DRAWINGS

DETAILED DESCRIPTION

Semiconductor structures comprising conductive vias and methods of forming conductive vias are provided. The methods comprise simultaneously applying a combination of two different gradient-driven migration processes, thermomigration and electromigration, to form the vias. Thermomigration causes a metal-semiconductor eutectic material to migrate through a solid substrate material that is subjected to a thermal gradient.

Electromigration comprises the application of an electric field to the substrate to provide a second driving force for moving the metal-semiconductor eutectic material through the substrate. The electric field additionally provides directional control of the movement of the metal-semiconductor eutectic material through the substrate.

Embodiments of the methods of forming conductive vias can be used to move metal-semiconductor eutectic material in a desired direction through the entire thickness of a layer of semiconductor material to form conductive vias having a desired orientation in the substrate. By combining electromigration and thermomigration, the methods provide directionally-controlled migration of metal-semiconductor eutectic material through substrates. Embodiments of the methods can achieve migration of metal-semiconductor eutectic material through the thickness of relatively thick substrates in a reasonable amount of time. The conductive vias can have low resistivity to reduce voltage drops across layers in which they are formed.

Figure 1:
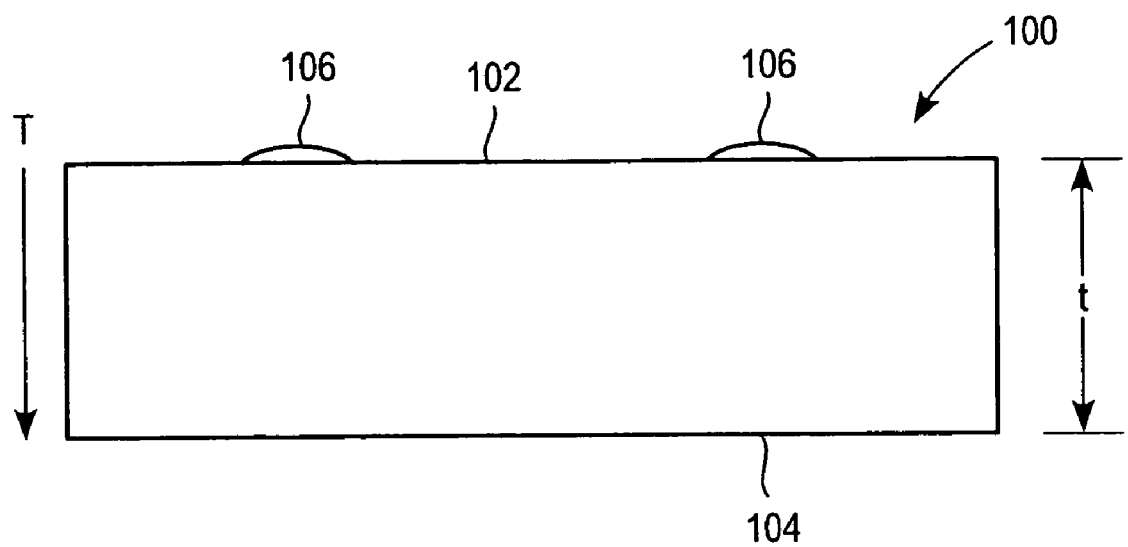
FIG. 1 is a side view of an exemplary embodiment of a substrate with metal particles for forming conductive vias formed on a top surface of the substrate.

FIG. 1 depicts an exemplary embodiment of a semiconductor substrate 100 prior to the formation of one or more conductive vias in the substrate. The substrate 100 can be a semiconductor wafer, for example. Semiconductor wafers can have a diameter of up to 200 mm or 300 mm, for example, with sizes larger for silicon and smaller for other semiconductors. The substrate 100 can comprise semiconductor materials including, but not limited to, silicon, germanium, gallium phosphide and gallium arsenide. The semiconductor material can optionally be doped p-type or n-type. The substrate 100 is preferably a single crystal material.

The substrate 100 comprises a top surface 102 and an opposite bottom surface 104. As shown, these surfaces are planar. The substrate 100 has a thickness, t. In the embodiment, the thickness can be about 3 µm to about 800 µm. In an exemplary embodiment, thin substrates having a thickness of about 3 µm to 10 µm, as well as substrates having a thickness of about 10 µm to about 200 µm, can be supported on a thicker base substrate (not shown). The base substrate can comprise, for example, of $SiO_2$, $Al_2O_3$, diamond, sapphire, a semiconductor material or a metal. The base substrate can comprise an electrical insulator, or a thin insulator layer can be formed between the thin substrate and the base substrate.

In embodiments of the methods of forming conductive vias, the metal that is used to form the conductive vias is located on the top surface of the substrate. The metal can be on a planar surface, or in depressions, for example. In the exemplary embodiment shown in FIG. 1, metal particles 106 are located on the top surface 102 of the substrate 100. A large number of metal particles 106 can be deposited on the top surface 102 to allow the simultaneous formation of a corresponding large number of conductive vias. In such embodiments, the metal particles 106 can be horizontally spaced from each other on the top surface 102 by a distance of about 10 µm to about 1 cm.

The metal forming the metal particles 106 can be, for example, aluminum, gold, silver, titanium, nickel, palladium, copper, gallium, indium and alloys thereof. The metal needs to form a liquid alloy with the semiconductor material of the substrate, where the liquid alloy has a lower melting temperature than the semiconductor material. For example, the metal and semiconductor material can form a eutectic.

The metal particles 106 can be deposited on the top surface 102 of the substrate 100 by various deposition techniques including, for example, screen printing, ink jet printing, evaporation, sputtering, chemical vapor deposition (CVD), plasma-enhanced chemical vapor deposition (PECVD), spray deposition, LIGA (which combines x-ray lithography with electroplating and molding), electrodeposition, electroless deposition, deposition of pre-formed nanoparticles and combinations thereof.

Figure 2:
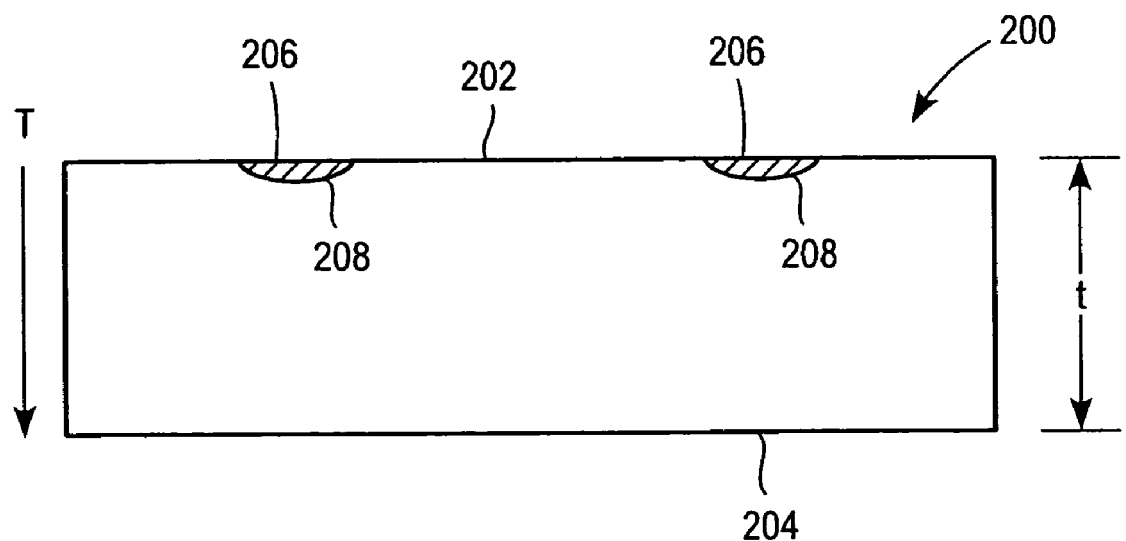
FIG. 2 is a side view of another exemplary embodiment of a substrate in which metal particles for forming conductive vias are located in depressions formed on a top surface of the substrate.

In another exemplary embodiment shown in FIG. 2, depressions 208 are formed in the top surface 202 of the substrate 200 to contain the metal 206 prior to depositing the metal, and heating the metal and migrating the metal-semiconductor eutectic material through the thickness, t, of the substrate 200 from the top surface 202 to the bottom surface 204. The depressions 208 serve to contain the metal to prevent it from moving across the top surface 202 prior to migration of the metal-semiconductor eutectic material through the substrate 200. The shape on the top surface 202 of the depressions 208 (and metal particles 206 formed in the depressions 208) can be selected to form the desired cross-sectional shape of the conductive vias in the substrate 200. For example, the depressions 208 can have shapes on the top surface 202 including round, polygonal shapes, such as square, rectangular, triangular, hexagonal, tetragonal and the like; elliptical or crescent shapes; or shapes, such as a line, a figure with a shape resembling the letter "C," "W," "L" and the like.

Depressions 208 can be formed in the top surface 202 of the substrate 200 by techniques including, for example, laser-drilling or photolithography and etching. The depressions 208 can be filled with the metal particles 206 by the deposition techniques described above. The depressions 208 can be filled with the same metal, or at least one depression 208 can be filled with a different metal than the other depressions 208 to enable the formation of conductive vias of different compositions in different regions of the substrate 200.

The depressions 208 have a sufficiently-large volume to contain a sufficient volume of the metal to form respective conductive vias that extend through the thickness, t, of the substrate 200 by migration. For example, the depressions 208 can have a maximum lateral dimension (e.g., diameter, width or length) of about 5 µm to about 200 µm, and a height of about 200 nm to about 20 µm. The number and spacing of the depressions 208 formed in the top surface 202 of the substrate 200 can be determined based on the desired density of conducting vias to be formed in the substrate 200.

Figure 3:
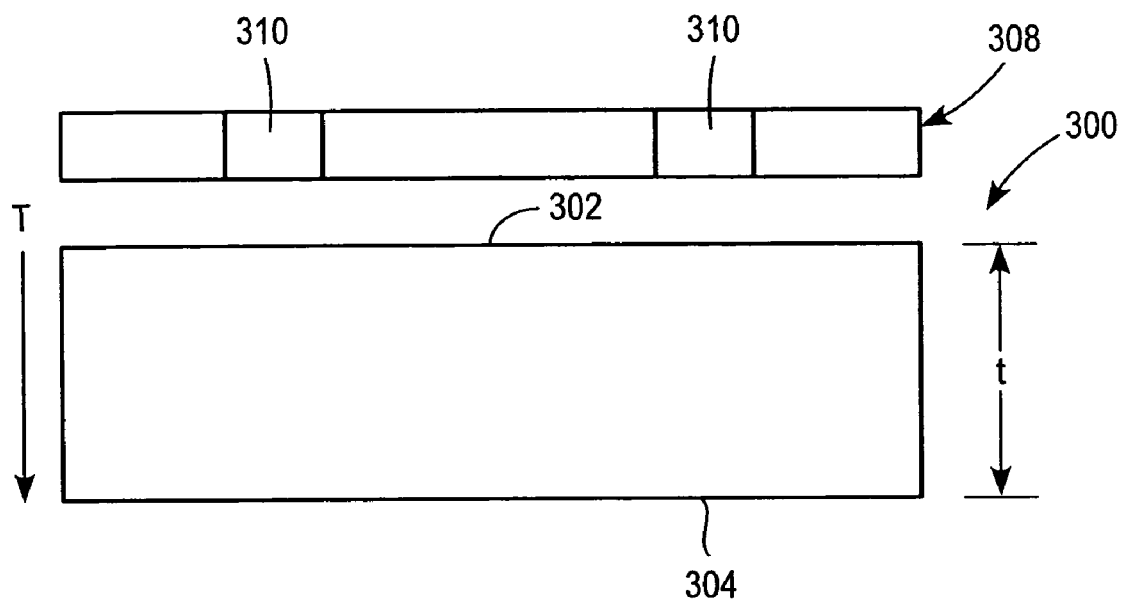
FIG. 3 is a side view of another exemplary embodiment of a substrate, which shows a mask positioned proximate a top surface of the substrate.

In another exemplary embodiment shown in FIG. 3, metal for forming the metal particles to form conductive vias is positioned using a mask 308. As shown, the mask 308 is a shadow mask positioned proximate the top surface 302 of the substrate 300. Alternatively, the mask 308 can be placed directly on the top surface 302 of the substrate 300 (not shown).

Figure 4:
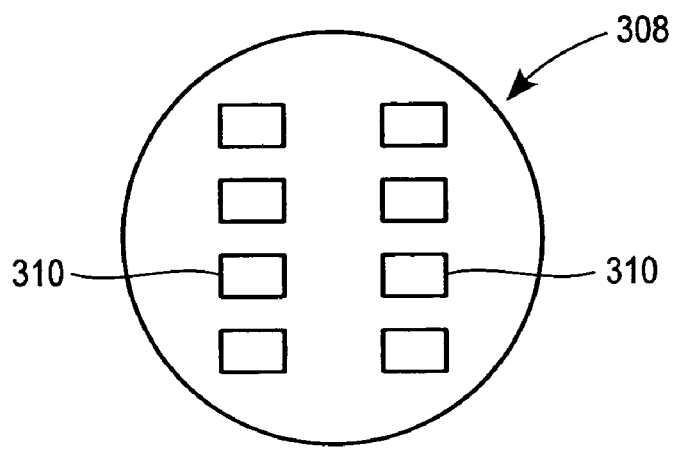
FIG. 4 is a top view of an exemplary embodiment of the mask shown in FIG. 3.

As shown in FIG. 4, the mask 308 includes multiple, laterally-spaced openings 310. In the embodiment, the openings 310 have a square shape on the top surface 302 of the substrate 300. The shape of the openings 310 can be selected, however, to form the desired cross-sectional shape of the conductive vias in the substrate 300. For example, the openings 310 can have other polygonal shapes, such as rectangular, triangular, hexagonal, tetragonal and the like; elliptical or crescent shapes; or shapes, such as a line, or a figure with a shape resembling the letter "C," "W," "L" and the like.

The size, number and spacing of the openings 310 in the mask 308 is based on the desired density of conducting vias that are to be formed in the substrate 300. For example, the openings 310 can have a maximum lateral dimension (e.g., diameter, width or length) of about 5 μm to about 200 μm.

To cause migration of metal-semiconductor eutectic material, the metal is heated to a temperature above its eutectic temperature or melting point, and a thermal gradient is applied across the thickness of the substrate to cause metal-semiconductor eutectic material to migrate in the direction from the top surface to the bottom surface of the substrate. As described below, an electric field is also applied during the migration process. The migrating metal-semiconductor eutectic material can be in the form of droplets, sheets or wires, for example.

In the embodiments shown in FIGS. 1, 2 and 3, a thermal gradient, $\Delta T$, is applied across the thickness, t, of the substrate 100, 200, 300, making the top surface 102, 202, 302 colder than the bottom surface 104, 204, 304, so that metal-semiconductor eutectic material migrates from the top surface to the bottom surface (i.e., up the thermal gradient).

Figure 5:
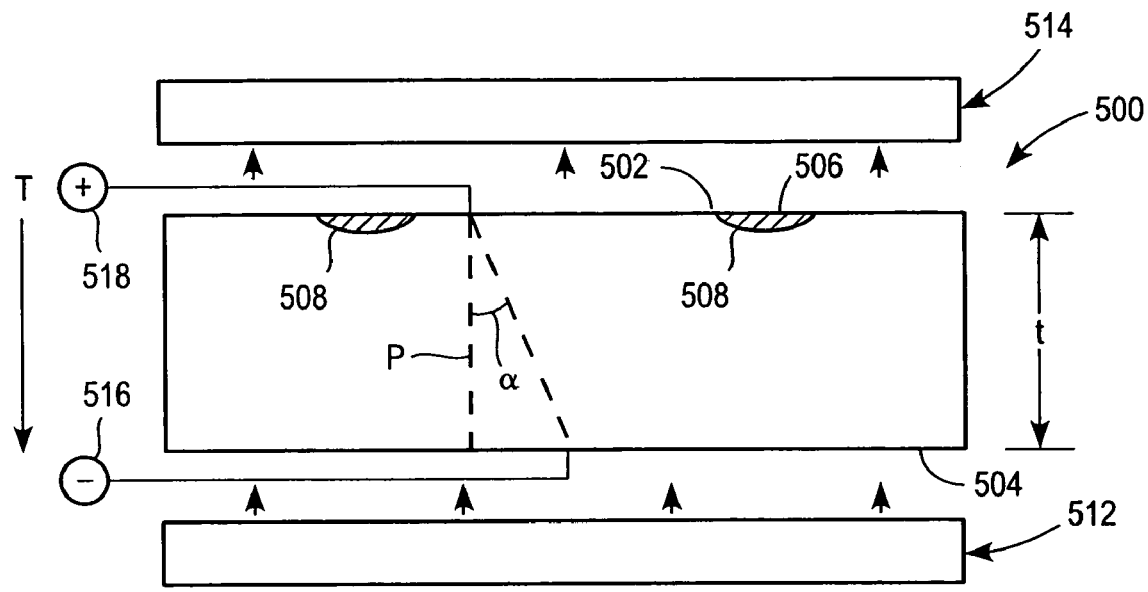
FIG. 5 is a side view of another exemplary embodiment of a substrate, showing a heat source facing a bottom surface and a heat sink facing a top surface of the substrate.

FIG. 5 depicts an exemplary embodiment including a heat source 512 and heat sink 514 to produce a thermal gradient across substrate 500. The substrate 500 includes metal 506 contained in depressions 508 on the top surface 500. The heat source 512 is positioned with respect to the bottom surface 504 of the substrate 500 to supply thermal energy to the bottom surface 504, to thereby heat the substrate 500 to a sufficiently-high temperature to create metal-semiconductor eutectic material and also create a thermal gradient, $\Delta T$, through the thickness, t, of the substrate 500. The minimum temperature to which the top surface 502 is heated must be above the semiconductor/metal eutectic temperature. The heat sink 514 is positioned with respect to the top surface 502 to enhance the removal of thermal energy that is conducted from the bottom surface 504 to the top surface 502 of the substrate 500.

The rate of thermomigration of metal-semiconductor eutectic material through the substrate 500 can be increased by increasing the magnitude of the thermal gradient across the substrate 500 and the average temperature of the substrate 500. Other factors that can be controlled to affect the rate of thermomigration include crystal orientation, pressure, and the particular materials of the substrate 500 and metal 506. The thermal gradient can typically be about 10° C./cm to about 100° C./cm, such as about 10° C./cm to about 50° C./cm. For example, for a silicon substrate 500 and aluminum as the metal 506 for forming conductive vias, the bottom surface 504 can be heated to a temperature of about 700° C. to about 1200° C., while the top surface 502 is cooled to a temperature that is about 10° C. to about 100° C. lower than the temperature of the bottom surface 504.

The heat source 512 can transfer heat to the bottom surface 504 of the substrate 500 (as depicted by arrows) by convection, radiation and/or conduction. For example, the heat source 512 can be tungsten halogen lamps or plasma arc lamps. As described in U.S. Patent Application Publication No. 20004/020618310 to Gee et al., an argon arc lamp produces an intense beam of light having a spectrum with a large percentage of UV/visible light, which couples efficiently into a silicon substrate near its surface because silicon is highly absorbing in the UV. In another embodiment, the heat source 512 can be a radiation block, such as molybdenum, which is heated to a desired temperature by resistance heating or by incident radiation from an electron-beam or other source. Radiation from the block heats the bottom surface 504 of the substrate 500 to a desired temperature, while the top surface 502 of the substrate is cooled by the heat sink 514. Radiation shields can be used to prevent radial thermal gradients from developing in the substrate 500. In another embodiment, the heat source can be a rapid thermal processor or a multi-zone furnace. Heating and cooling of the substrate 500 can be conducted under vacuum, or in a protective gaseous atmosphere (e.g., an inert gas), to prevent the formation of compounds in the substrate that interfere with the thermomigration process.

The top surface 502 of the substrate 500 can be cooled using any suitable heat sink 514. Thermal energy can be transferred to the heat sink 514 (as depicted by arrows) by conduction, radiation and/or convection. A cooling fluid, such as water or a gas, can be flowed through the heat sink 514.

The electric field can be applied across the thickness of the substrate 500 by any suitable technique that provides control of the local directionality of the applied field. For example, an electric field can be applied externally to the substrate. In exemplary embodiments, the substrate can be rotated through a sequence of one or more discrete angles during the formation of the conductive vias, so that the electric field extends in a sequence of desired directions through the substrate, thereby controlling the direction of the segments of the conductive vias formed in the substrate.

FIG. 5 depicts another exemplary technique for applying an electric field to the substrate. In the exemplary embodiment shown in FIG. 5, cathode 516 is electrically connected to the bottom surface 504 of the substrate, and anode 518 is electrically connected to the top surface 502. Cathode 516 and anode 518 are electrically connected to a DC power supply (not shown). The flow of DC current, and the direction of the electric field through the substrate, is from the anode 518 to the cathode 516, i.e., from the top surface 502 to the bottom surface 504. In the embodiment, the cathode 516 is connected to the bottom surface 504 at a position horizontally offset relative to the position at which the anode 518 is connected to the top surface 502. The direction of the electric field from the anode 518 to the cathode 516 through the thickness of the substrate 500 is approximately at an angle, $\alpha$, measured relative to the perpendicular, P, to the top surface 502.

In another exemplary embodiment (not shown), the anode can be electrically connected to the substrate at the bottom surface and the cathode at the top surface. In this embodiment, the direction of the electric field through the substrate is from the bottom surface to the top surface.

In the methods of forming conductive vias, it is desirable that the thermal gradient and the applied electric field both act to move the metal-semiconductor eutectic material in the same general direction through the substrate, i.e., from the top surface to the bottom surface, or from the bottom surface to the top surface, to maximize the combined effect of these different migration processes on the velocity of metal-semiconductor eutectic material migration through the thickness of the substrate, as well as to provide directional control of this migration. The electric field provides added directional control.

As described in U.S. Pat. No. 4,377,423 to Anthony, different metals electromigrate toward either the anode or cathode in silicon when an electric field is applied across the silicon. Particularly, in silicon, aluminum, silver, gallium and indium electromigrate toward the cathode, while palladium, gold and copper electromigrate toward the anode, in response to the applied electric field. Accordingly, in the embodiment shown in FIG. 5, when aluminum, silver, gallium or indium is used as the metal 506 to form the conductive vias, and silicon is the material of the substrate 500, these metals will each migrate through the substrate 500 from the top surface 502 to the bottom surface 504 in response to the applied electric field, because these metals migrate toward the cathode in silicon. Accordingly, for these metals, it is preferable that the cathode 516 be connected to the bottom surface 504 and the anode 518 be connected to the top surface 502, when the thermal gradient is applied in the direction from the top surface 502 to the bottom surface 504, in order to maximize the combined effect of thermomigration and electromigration on the velocity of metal-semiconductor eutectic material migration through the thickness of the substrate 500.

In other embodiments in which the anode is electrically connected to the bottom surface 504 and cathode to the top surface 502 of the substrate 500 (not shown), palladium, gold and copper will electromigrate from the top surface 502 to the bottom surface 504, because these metals migrate toward the anode in silicon. Accordingly, for these metals, it is preferable that cathode 516 be connected to the top surface 502 and anode 518 to bottom surface 504 when the thermal gradient is applied in the direction from the top surface 502 to the bottom surface 504, in order to maximize the combined effect of thermomigration and electromigration on the velocity of metal-semiconductor eutectic material migration through the thickness of the substrate 500.

Figure 6:
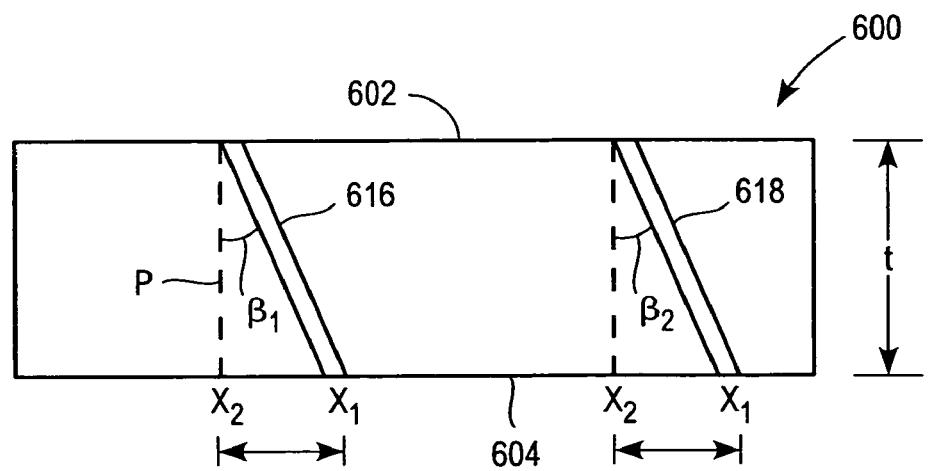
FIG. 6 is a side view of the substrate shown in FIG. 5 after angled conductive vias have been formed through the substrate.

FIG. 6 depicts an exemplary substrate 600 including conductive vias 616, 618 formed through the substrate by applying the combination of the thermal gradient and electric field. While a thermal gradient is applied across the thickness, t, of the substrate 600 to cause the metal-semiconductor eutectic material to move from the top surface 602 to the bottom surface 604, application of the electric field allows the migrating metal-semiconductor eutectic material to be locally directed, or steered, through the substrate 600 so that the metal-semiconductor eutectic material exits at the bottom surface 604 at apposition that is horizontally offset from its position at the top surface 602 where the metal-semiconductor eutectic material entered the substrate 600.

In the embodiment shown in FIG. 6, the conductive vias 616, 618 are oriented at acute angles $\beta_1$ and $\beta_2$, respectively, with respect to a perpendicular, P, to the top surface 602. As shown, $\beta_1$ and $\beta_2$ are approximately equal. The angles $\beta_1$ and $\beta_2$ can approximate the angle a shown in FIG. 5. In other words, the orientation of the electric field approximates the orientation of the conductive vias formed through the substrate. The angles $\beta_1$ and $\beta_2$ are preferably less than about 45°, such as less than about 40°, 30°, 20°, 10°, or 5°.

In another exemplary embodiment, the angles $\beta_1$ and $\beta_2$ can be different from each other. Such different orientations of the conductive vias can be achieved by applying electric fields acting in different directions through the substrate to different regions of the substrate.

In another exemplary embodiment, at least one angled conductive via oriented at an acute angle to the perpendicular can be formed in a substrate that also includes at least one non-angled conductive via, i.e., a conductive via that is perpendicular to the top and bottom surfaces of the substrate.

In another exemplary embodiment, in substrates at least one conductive via can be formed that includes at least two segments. The segments can each be directed at an angle of more than 0° with respect to the top surface, with the angles being different from each other. For example, one segment can extend at an acute angle to a perpendicular to the top surface of the substrate, while the other segment can extend perpendicular to the top surface.

In exemplary embodiments, conductive vias can be formed that provide a continuous path of low resistivity in semiconductor material layers. In exemplary embodiments, conductive vias can be formed that have a substantially constant cross-sectional shape along at least substantially their entire length. In exemplary embodiments, conductive vias can be formed that have an at least substantially constant direction through substrates.

Forming conductive vias in semiconductor substrates that extend continuously in a defined direction (i.e., a controlled, non-arbitrary direction) through the substrate, or conductive vias that include more than one segment, each of which extends in a defined direction in the substrate, can provide advantages in semiconductor device processing. First, angled conductive vias can reduce the length of interconnections. As shown in FIG. 6, the conductive vias 616, 618 exit at the bottom surface 604 of the substrate 600 at positions, $x_1$. For comparison, conductive vias formed perpendicular to the top surface 602 of the substrate 600 would emerge on the bottom surface 604 at position, $x_2$, which is spaced a distance, $\Delta x$, from $x_1$. The length of the angled conductive vias 616, 618 is less than the sum of the length of the perpendicular conductive vias (i.e., t) and the distance $\Delta x$. Accordingly, forming angled conductive vias 616, 618 reduces the length of the interconnection from the entry positions of the conductive vias 616, 618 at the top surface 602 to the position $x_2$ at the bottom surface 604 of the substrate 600. The resistance of the interconnects may also be reduced by reducing interconnect lengths.

Forming the angled conductive vias 616, 618 also allows electrical connections between positions on the top surface 602 and bottom surface 604 of the substrate 600 that are not otherwise accessible by perpendicular conductive vias. For example, referring to FIG. 6, where it is desired to form an electrical connection between a first component that is to be formed at the entry location of conductive via 616 at the top surface 602, and a second component that is to be formed at the position $x_1$ on the bottom surface 604, but another component that will be formed at the position $x_2$ prevents the formation of a perpendicular conductive via between the entry position and $x_2$, the angled conductive via 616 allows the direct electrical connection of the first and second components.

Figure 7:
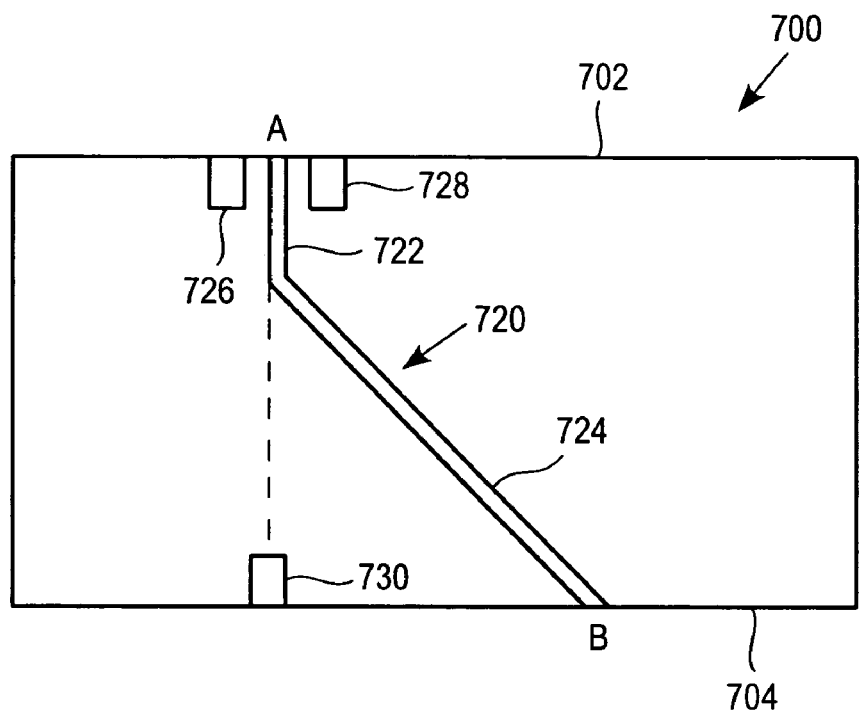
FIG. 7 is a side view of another exemplary embodiment of a semiconductor substrate including a conductive via having a perpendicular segment and an angled segment.

FIG. 7 depicts another embodiment in which a conductive via 720 includes two segments having different defined directions from each other. As shown, the conductive via 720 includes a perpendicular segment 722 and an angled segment 724 formed in a substrate 700. As shown, components 726 and 728 (e.g., electrical components) are formed in the top surface 702, and a component 730 (e.g., a photonic component, such as a wave guide) is formed in the bottom surface 704 of the substrate 700. In the embodiment, due to the type of component 730 formed in the bottom surface 704, it is not possible to form a perpendicular via that connects the point A on the top surface 702 between components 726, 728 to the component 730. Also, due to the depth of components 726, 728 in the top surface 702, it is not possible to form an angled conductive via that extends from point A on the top surface 702 to point B on the bottom surface 704. By forming the conductive via 720 with a perpendicular segment 722 and an angled segment 724, it is possible to directly electrically connect point A on the top surface 702 to point B on the bottom surface 704.

Figure 8:
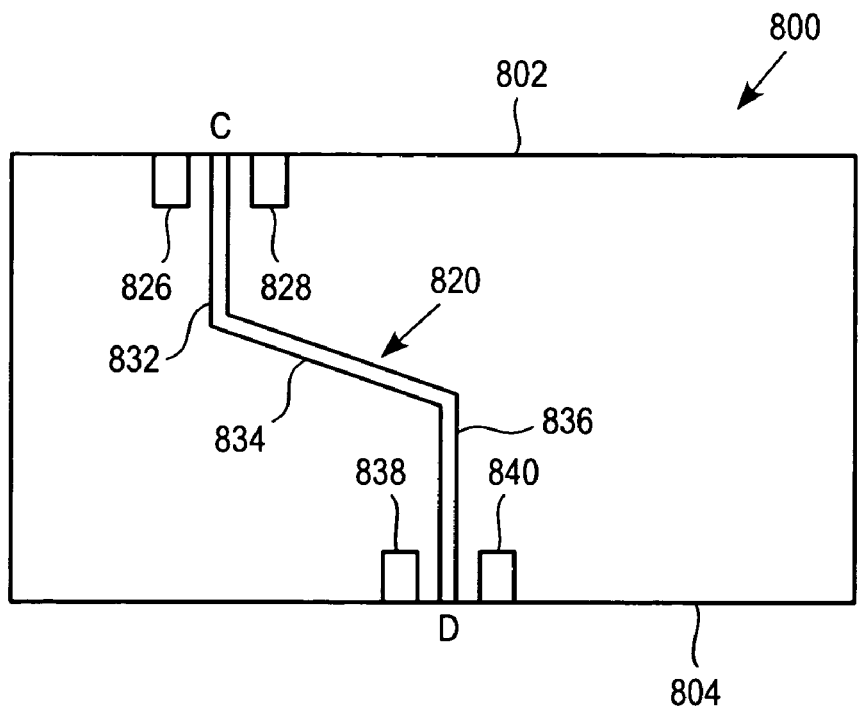
FIG. 8 is a side view of another exemplary embodiment of a substrate including a conductive via having a two perpendicular segments and an angled segment.

Other exemplary embodiments of the conductive vias can include more than two segments. The conductive vias can include one or more perpendicular segments and/or one or more angled segments. The individual segments can have different lengths, and the angled segments can have the same or different defined directions in a substrate. The angled segments can extend at defined angles of more than 0° relative to the top surface of the substrate. For example, the conductive via 820 shown in FIG. 8 includes a first perpendicular segment 832, an angled segment 834 and a second perpendicular segment 836. In substrate 800, the conductive via 820 provides an interconnection between point C located between components 826, 828 formed in the top surface 802 and point D located between components 838, 840 formed in the bottom surface 804.

The conductive vias having both angled and perpendicular segments, or angled segments with different defined directions, can be formed, for example, by sequentially electrically connecting pairs of anodes and cathodes at more than one location at the top surface and/or bottom surface of substrates in which the conductive vias are formed (e.g., a first anode on the top surface with a first cathode on the bottom surface, and then the first anode with a second cathode on the bottom surface), so that the electric field extends in a sequence of desired directions through the substrate, thereby controlling the direction of the segments of the conductive vias formed in the substrate.

In some situations, two devices that are to be formed on or in the top surface (or on or in a layer formed on the top surface) and/or on or in the bottom surface (or on or in a layer formed on the bottom surface) are laterally spaced too closely to each other to be able to form a conductive via of adequately low resistance having a circular or polygonal cross-section between the devices. In such situations, the cross-sectional shape of the angled conductive vias can be appropriately selected to allow formation of the conductive vias between the closely-spaced devices. For example, a conductive via having a reduced width dimension, such as one having a linear or elliptical cross-section, can be formed between closely-spaced devices to allow electrical interconnection between devices on opposite surfaces of the substrate.

Accordingly, the angled conductive vias and the conductive vias including both perpendicular and angled segments, or differently directed angled segments, can offer enhanced design flexibility. The conductive vias can provide interconnection to various devices and electrical circuits formed in or affixed to the opposite top and bottom surfaces of the substrate, or provided in layers formed on the top and bottom surfaces. The devices can be electronic devices including transistors, and/or photonic devices that convert optical energy into electrical energy including photodiodes, devices that guide light, devices that perform operations on light, and devices that emit light including incoherent sources, such as light-emitting diodes, and coherent sources in the form of lasers. For example, the conductive vias can provide interconnections to electrical layers that contain one or more electrical devices, optical layers that carry optical signals, and photonic layers that contain one or more photonic devices.

Figure 9:
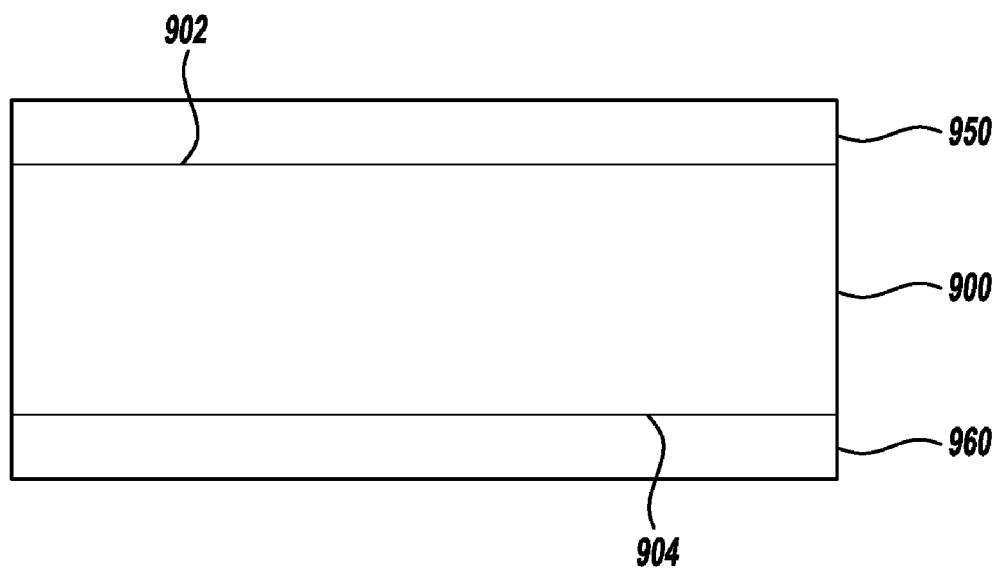
FIG. 9 is a side view of an exemplary structure including a substrate and layers formed on top and bottom surfaces of the substrate.

For example, as shown in FIG. 9, an electrical layer 950 formed on or in the top surface 902 of substrate 900 and including electrical circuit devices can be electrically connected to a photonic layer 960 formed on or in the bottom surface 904 of substrate 900 and including photonic devices, to allow electrical signals to be transferred through the substrate 900 from the electrical devices to the photonic devices.

Figure 10:
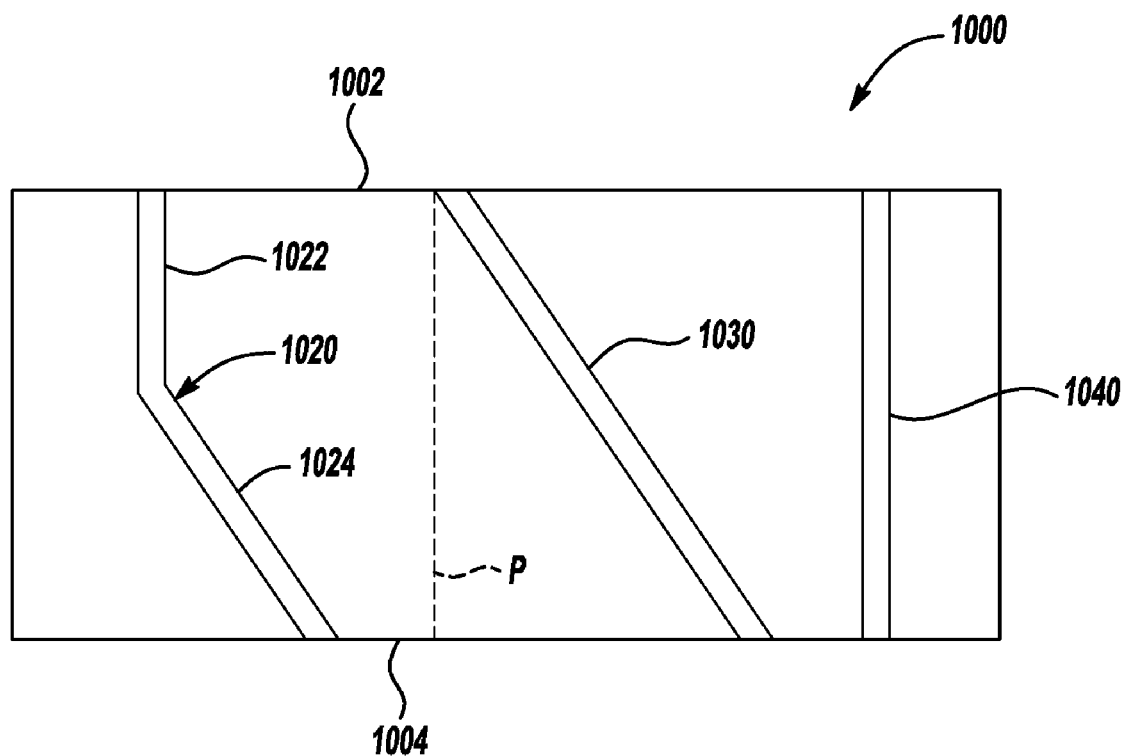
FIG. 10 is a side view of another embodiment of a substrate including i) an angled conductive via, ii) a conductive via that is substantially perpendicular to top and bottom surfaces of the substrate, and iii) a conductive via having a perpendicular segment and an angled segment.

FIG. 10 depicts yet another embodiment of the semiconductor structure, which includes a conductive via 1020 that extends though the substrate 1000 that includes two segments; a segment 1022 that is substantially perpendicular to the top surface 1002, and a segment 1024 that is angled to the bottom surface 1004. The structure further includes another conductive via 1030 that extends continuously through the substrate 1000 at an acute angle relative to a perpendicular P to the top surface 1002, and yet another conductive via 1040 that also extends continuously through the substrate 1000 that is substantially perpendicular to the top surface 1002.

Embodiments of substrates can have a high density of conductive vias having a small cross-section, making the substrates suitable for high-bandwidth communication applications.

By forming conductive vias in substrates by the combined use of thermomigration and electromigration, the substrates are not subjected to mechanical hole forming operations, such as laser drilling, which can weaken or damage substrates and, consequently, reduce their reliability.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

The invention claimed is:

1. A semiconductor structure, comprising:
    a substrate comprising a semiconductor material and having a first surface and an opposite second surface;
    a first conductive via extending continuously through the substrate from the first surface to the second surface, the first conductive via including at least one first segment extending at a defined first angle of more than 0° relative to the first surface and at least one second segment extending at a defined second angle of more than 0° relative to the first surface, wherein the first angle is different from the second angle; and
    at least one of:
        a second conductive via extending continuously through the substrate from the first surface to the second surface at an acute angle defined relative to a perpendicular to the first surface; or
        a third conductive via extending continuously through the substrate from the first surface to the second surface substantially perpendicular to the first surface.

2. The semiconductor structure of claim 1, wherein the first angle is an acute angle defined relative to a perpendicular to the first surface and the second angle is substantially perpendicular to the first surface.

3. The semiconductor structure of claim 1, wherein at least one of the first, second and third conductive vias has a non-circular cross-section along at least a portion of its length.

4. The semiconductor structure of claim 1, wherein:
    the substrate comprises silicon and the first, second and third conductive vias comprise Al, Au, Ga, In, Pd, Cu, Ag, Ti or Ni; and
    the semiconductor structure further comprises:
        a first electrical, optical or photonic layer formed on or in the first surface of the substrate; and
        a second electrical, optical or photonic layer formed on or in the second surface of the substrate;
        wherein the first, second and third conductive vias form an electrical connection between the first and second layers.

* * * * *